(12) United States Patent
Collados Asensio et al.

(10) Patent No.: US 8,086,189 B2
(45) Date of Patent: Dec. 27, 2011

(54) PHASE-TO-FREQUENCY CONVERSION FOR POLAR TRANSMITTERS

(75) Inventors: Manel Collados Asensio, Eindhoven (NL); Nenad Pavlovic, Eindhoven (NL); Vojkan Vidojkovic, Eindhoven (NL); Paulus T. M. Van Zeijl, Veldhoven (NL)

(73) Assignee: NXP B.V., Eindhoven (NL)

( * ) Notice: Subject to any disclaimer, the term of this patent is extended or adjusted under 35 U.S.C. 154(b) by 464 days.

(21) Appl. No.: 12/374,491

(22) PCT Filed: Jun. 19, 2007

(86) PCT No.: PCT/IB2007/052348
§ 371 (c)(1), (2), (4) Date: Jan. 21, 2009

(87) PCT Pub. No.: WO2008/001269
PCT Pub. Date: Jan. 3, 2008

(65) Prior Publication Data
US 2010/0130143 A1 May 27, 2010

(30) Foreign Application Priority Data
Jun. 28, 2006 (EP) .................................. 06116188

(51) Int. Cl.
*H04B 1/02* (2006.01)
*H04L 27/00* (2006.01)

(52) U.S. Cl. ........ 455/102; 455/108; 455/110; 455/118; 455/205; 375/295; 375/296

(58) Field of Classification Search ............. 455/91, 455/102, 108, 110, 111, 113, 115.1, 116, 455/118, 119, 126, 150.1, 192.1, 205, 313, 455/323; 330/136, 140, 151; 375/295–302, 345, 371, 373, 375, 376, 259, 278, 285
See application file for complete search history.

(56) References Cited

U.S. PATENT DOCUMENTS
4,972,440 A 11/1990 Ernst et al.
(Continued)

FOREIGN PATENT DOCUMENTS
EP 1536554 A 6/2005

OTHER PUBLICATIONS
Sander, W.B., et al; "Polar Modulator for Multi-Mode Cell Phones"; Proceeding Fo the IEEE 2003 Custom Integrated Circuits Conference; vol. Conf. 23; Sep. 21, 2003; pp. 439-446; IEEE New York, NY, USA; ISBN: 0-7803-7842-3; XP010671064.

*Primary Examiner* — Pablo Tran

(57) ABSTRACT

The present invention relates to a polar transmission method and a polar transmitter for transmitting phase and amplitude components derived from in-phase (I) and quadrature-phase (Q) components of an input signal. A first conversion is provided for converting the in-phase (I) and quadrature-phase (Q) components into the phase and amplitude components at a first sampling rate. Additionally, a second conversion is provided for converting the phase component into a frequency component, wherein the second conversion comprises a rate conversion for converting the first sampling rate into a lower second sampling rate at which the frequency component is provided. Thereby, the second sampling rate can be used as a lower update rate in a digitally controlled oscillator in order to save power or because of speed limitations, while the surplus phase samples obtain due to the higher first sampling rate enable better approximation of the phase component after the digitally controlled oscillator. This better approximation accounts for a cleaner spectrum around the synthesized channel.

9 Claims, 7 Drawing Sheets

U.S. PATENT DOCUMENTS

| | | |
|---|---|---|
| 6,834,084 B2 | 12/2004 | Hietala |
| 6,985,703 B2 | 1/2006 | Groe et al. |
| 6,987,417 B2 * | 1/2006 | Winter et al. .................. 330/10 |
| 7,126,999 B2 * | 10/2006 | Dent ............................. 375/261 |
| 7,359,680 B2 * | 4/2008 | Klemmer ...................... 455/102 |
| 7,394,862 B2 * | 7/2008 | Jensen et al. ................. 375/272 |
| 7,424,064 B2 * | 9/2008 | Shakeshaft et al. ........... 375/295 |
| 7,515,647 B2 * | 4/2009 | Kishi ............................ 375/295 |
| 7,869,541 B2 * | 1/2011 | Frantzeskakis et al. ....... 375/296 |
| 2002/0168019 A1 * | 11/2002 | Bengtsson et al. ............ 375/295 |
| 2002/0191727 A1 | 12/2002 | Staszewski et al. |
| 2004/0212445 A1 | 10/2004 | Haglan |
| 2005/0271161 A1 | 12/2005 | Staszewski et al. |
| 2008/0205549 A1 * | 8/2008 | Rofougaran ................... 375/299 |
| 2009/0206940 A1 * | 8/2009 | Collados Asensio et al. 332/103 |
| 2009/0323510 A1 * | 12/2009 | Furrer et al. .................. 370/210 |

* cited by examiner

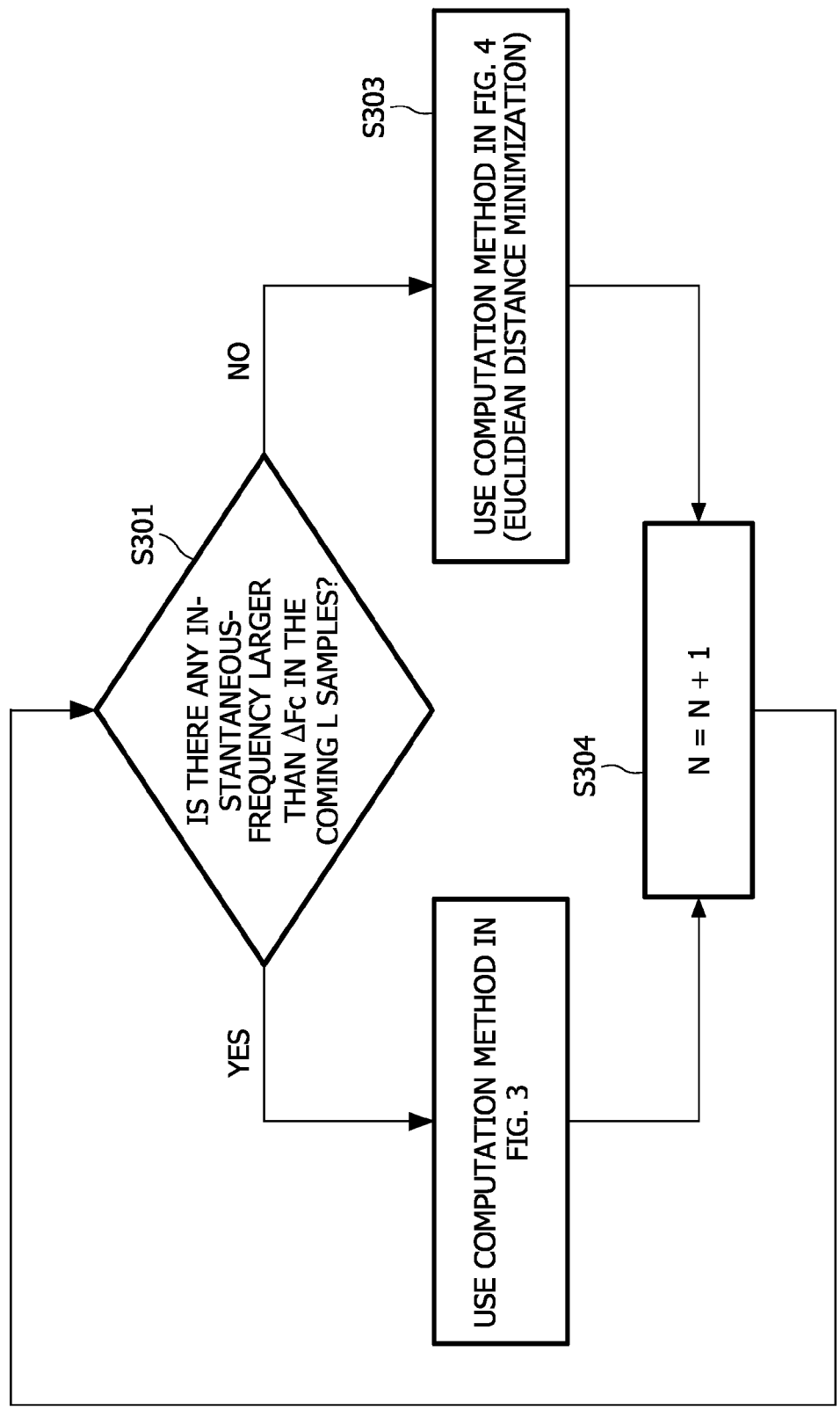

PHASE-TO-FREQUENCY CONVERSION FOR POLAR TRANSMITTERS

The present invention relates to a polar transmission method and polar transmitter for deriving phase and amplitude components from in-phase (I) and quadrature-phase (Q) components of an input signal.

In current power amplifier (PA) designs, linearity and power efficiency are key requirements. This problem becomes even more demanding for wireless communication systems having amplitude and phase modulation, e.g., quadrature amplitude modulation (QAM). Especially for wireless communication systems using orthogonal frequency division multiplex (OFDM) as modulation scheme, the above problem gets even worse due to the fact that OFDM signals possess high peak to average ratios (e.g. 10 dB) which imposes high linear operation requirements on driving schemes for the PAs of these OFDM communication systems. However, such linearity demands lead to significant reductions of efficiency of the PAs.

In order to solve efficiency requirements, polar modulation technology has been developed to facilitate system design. A polar modulator can independently process a carrier's amplitude and phase signals, typically working together with a non-linear power amplifier operating in switched mode. The elimination of the linear operation requirement enables power amplifier efficiency to be maximized for each modulation standard. Under a polar modulation scheme, multimode operation may be achieved by digital switching.

In a conventional polar modulator, a baseband digital processor provides I and Q signals that are up-converted with an IQ mixer to the RF frequency, using a phase locked loop (PLL) circuit and an IQ phase shifting circuit. The up-converted signals are combined, and the combined phase modulated signal is then supplied via a bandpass filter to a phase modulation driver which applies it to an output stage. On the other hand, an envelope modulated signal is generated and supplied to the output stage. At the output stage, the envelope modulated signal is combined with the phase modulated signal to generate an amplified polar modulated signal which is supplied to a transmission antenna. Thus, RF (Radio Frequency) blocks are fed with envelope and phase signals (or a function of the two).

In the U.S. Pat. No. 4,972,440A a polar modulation architecture is disclosed, where complex samples of a phase shift keying (PSK) signal are decomposed into phase and envelope samples using two programmable read-only memories (PROM's). Subsequently, envelope samples are used to control the DC power voltage of a class-C amplifier, and phase samples are fed to a phase modulator.

In more recent times there has been a renewed interest in the use of polar modulation techniques for new wireless communication systems. It is expected that new architectures based on polar modulation will allow for more power efficient transmitters, or/and immunity to VCO-pulling, or/and better portability to new technology nodes (C090, C065 . . . ). Quite a number of these architectures introduce the phase modulation in the same phase-locked-loop (PLL) used to synthesize the carrier frequency signal. More recently, digital PLL implementations have appeared accompanied by digitally controlled oscillators (DCOs) in place of voltage controlled oscillators (VCOs). The US 2002/0191727, for example, discloses an architecture, where the synthesized frequency is controlled by a digital word indicating a desired instantaneous oscillating frequency.

Therefore, when using a PLL to obtain the desired phase modulation, the phase samples, which are usually generated using the COordinate Rotation DIgital Computer (CORDIC) algorithm, have to be differentiated to produce instantaneous frequency samples. Then, the instantaneous frequency samples are used to shift the DCO oscillating frequency in such a way that the required phase is accumulated at the end of the sampling interval, or they can also be fed to a digital-to-analogue converter if a VCO is used. Given a polar architecture and a certain modulation type, the minimum update rate required for the envelope signal does not necessarily coincide with the minimum update rate required for the phase. By the term "minimum", the minimum sampling ratio which provides a satisfactory (standard compliant) transmit signal quality is meant.

The CORDIC algorithm always produces both signals at the same rate. In this situation, the CORDIC block has to work at the highest required update rate and then, unnecessary samples of the over-sampled signal have to be disregarded.

It is however difficult to synthesize clean signals, or more specifically, to obtain signals compliant with standardized or customer-imposed transmit spectrum masks.

It is an object of the present invention to provide a polar transmitter and polar transmission method, by means of which trade-off between required phase signal update rate and spectrum purity can be optimized.

This object is achieved by a polar transmitter as claimed in claim 1 and by a polar transmission method as claimed in claim 8.

Accordingly, the second sampling rate can be used as a lower update rate in a digitally controlled oscillator in order to save power or because of speed limitations, while the surplus phase samples obtain due to the higher first sampling rate enable better approximation of the phase component after the digitally controlled oscillator. This better approximation accounts for a cleaner spectrum around the synthesized channel.

The second converter may comprise an interpolator for interpolating input samples of the phase component at the first sampling rate by a first factor, a reconstruction filter for filtering the interpolated samples, and a down-sampler for down-sampling calculated samples of the frequency component by a second factor. This provides the advantage that the input phase sampling rate and the output frequency update rate do not have to be related by an integer value and can be related by any rational value.

Furthermore, the second converter may comprise a frequency calculator for calculating the frequency component by using a currently realized sample of the phase component so that the distance (e.g. Euclidean distance) between input samples of the phase component at the first sampling rate and a linearly interpolated phase during a predetermined number of sampling intervals is minimized. By the inclusion of the predetermined number of sampling intervals, a selection of local minima can be avoided, so that the phase component approximation in subsequent sampling intervals is not worsened.

In a specific example, the frequency calculator may be adapted to obtain a quantized frequency component by mapping a calculated frequency component to a closest available quantization value. Additionally, the frequency calculator may be adapted to calculate the next realized sample of the phase component based on the currently realized sample of the phase component and the quantized frequency component.

As an additional option, the second converter may comprise switching means for comparing a frequency component obtained from upcoming samples of the phase component with a predetermined threshold value, and for switching between the rate conversion and a linear approximation without rate conversion, in response to the result of the comparison. Thereby, approximation errors caused by sudden phase changes can be alleviated.

Further advantageous developments or modifications are defined in the dependent claims.

The present invention will now be described based on preferred embodiments with reference to the accompanying drawings, in which:

FIG. 8 shows a schematic flow diagram of a modified procedure for deriving an instantaneous frequency, according to a second preferred embodiment.

The preferred embodiments will now be described in connection with a polar transmitter architecture which makes use of an IQ modulation in a wireless communication system, such as Bluetooth 2.0 EDR (Enhanced Data Rate), UWB (Ultra-Wideband), WLAN (Wireless Local Area Network) or GSM EDGE (Global System for Mobile communication Enhanced Data rates for GSM Evolution).

Given an arbitrary baseband signal, described using the Cartesian decomposition, the spectrum of its magnitude and phase components is generally much wider than the spectra of its Cartesian components (in-phase and quadrature signals). The spectrum of any of the Cartesian components basically coincides with the spectrum of the finally transmitted signal (apart from a frequency shift to the carrier frequency). This means that in order to synthesize a clean spectrum, the magnitude and phase signals need to be over-sampled with respect to their Cartesian counterparts. This presents a serious challenge, especially when dealing with in-phase and quadrature signals that are already wide, like in IEEE 802.11a/g.

Figure 1:
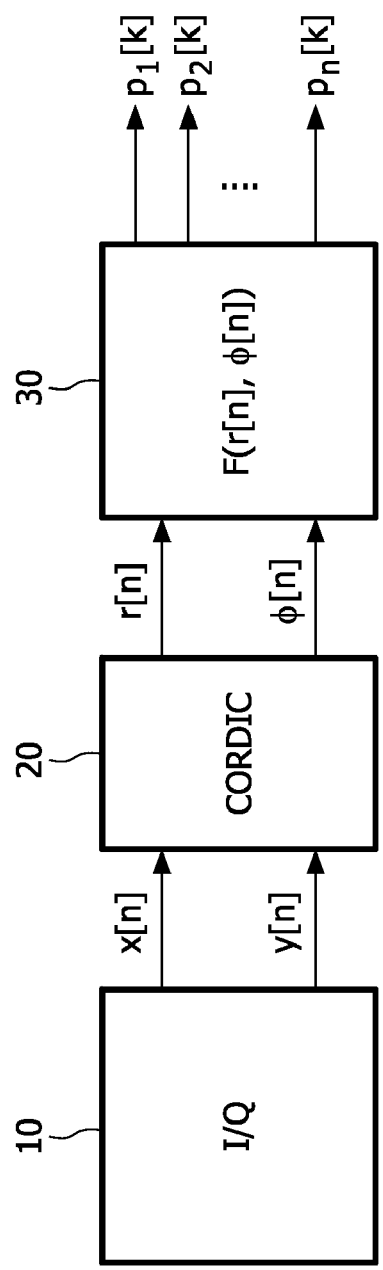
FIG. 1 shows a schematic functional block diagram of a concept of deriving polar signals.

FIG. 1 shows a schematic functional block diagram of conventional signal generation in a generic polar transmitter. An I and Q signal generation block 10 generates the in-phase (I) and quadrature (Q) samples (x[n] and y[n]) according to a predetermined standard being implemented, e.g., IEEE 802.11a/b/g or EDR Bluetooth. The sampling frequency of these signals is derived taking into account the minimum sampling frequency required for the phase and envelope signals (r[n], $\phi$[n]) rather than the bandwidth of the quadrature samples themselves. The phase and envelope signals are calculated in a CORDIC (COordinate Rotation DIgital Computer) block 20, which needs to operate at the same sampling frequency. Subsequently, the phase and envelope signals might be fed to an arbitrary function generator 30 (F(r[n], $\phi$[n])) to produce the polar signals ($p_1$[n], $p_2$[n], ..., $p_k$[n]), which finally control the polar transmitter. As an example, the arbitrary function generator might be such that k=2, $p_1$[n]=r[n], and $p_2$[n]=$\phi$[n+1]−$\phi$[n].

In general, the CORDIC algorithm applied in the CORDIC block 10 is based on a calculation method used to approximate standard transcendental functions. It does not use calculus based methods such as polynomial or rational function approximation.

Given a polar architecture and a certain modulation type (OFDM, CDMA, QPSK ...), the update rate required for the envelope (magnitude) signal does not necessarily coincide with the update rate required for the phase. It depends on the reconstruction filters used for the magnitude and phase, the recombination procedure, the required performance, etc. However, the CORDIC algorithm makes available, by the nature of its own working, both phase and envelope signals at the same sampling rate. In this situation, the CORDIC block 20 has to work at the highest required update rate and then, unnecessary samples of the over-sampled signal have to be disregarded. This is a waste that can be corrected either by updating both signals at the high rate—which is good for precision, but perhaps an unnecessary waste of power—or by reusing as much of the available information before down-sampling the over-sampled signal to the actually required update rate.

In some other circumstances, e.g., to obtain a better phase approximation, the baseband engine (CORDIC, DSP, look-up table, etc.) might be chosen to produce a high-frequency phase data stream, although eventually a lower update rate in the DCO is used in order to save power, or because of speed limitations in the DCO.

In the preferred embodiments, the phase-to-frequency conversion process in a polar transmitter is optimized by providing a higher sampling rate at the baseband engine than the one eventually used to update the PLL, and by using a phase-to-frequency converter not only to compute the instantaneous frequency, quantize, and when necessary clip, but also to change the data rate (down-sample) and perform all previously mentioned tasks (frequency computation, quantization, and clipping) in such a way that the spectrum purity of the final result is optimized. That is, the surplus phase samples can be used to obtain a better approximation of the phase signal after the DCO. This better approximation accounts for a cleaner spectrum around the synthesized channel.

The following exemplary implementations according to the first and second preferred embodiments are suitable for example for the IEEE 802.11a/b/g standard.

Figure 2:
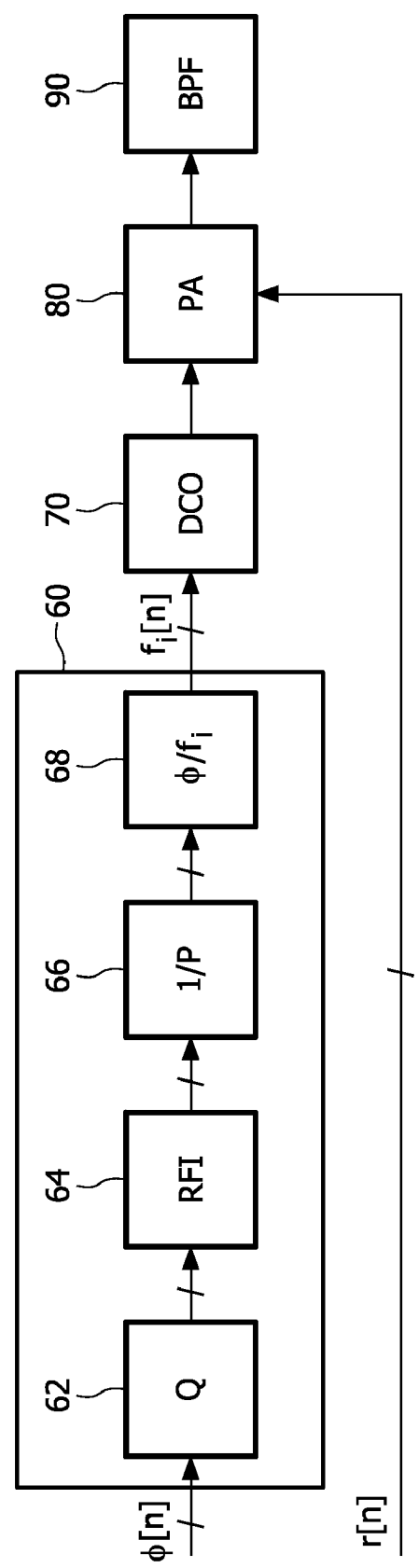
FIG. 2 shows a schematic functional block diagram of a polar transmitter according to a first preferred embodiment.

FIG. 2 shows a schematic functional block diagram of a polar transmitter architecture according to the first preferred embodiment. Instantaneous frequency samples $f_i$[n] are obtained from a phase-to-frequency converter 60 based on input phase samples $\phi$[n] and are applied to a DCO 70 of a PLL circuit used to synthesize a carrier signal, while envelope samples r[n] are applied to an amplitude control device, e.g., a power amplifier (PA) 80, in a zero-order-hold fashion, i.e., the input is sampled and held for a specified sample period. This kind of polar transmitter requires a much higher update rate for the envelope, in order to push the stronger aliases coming from the zero-order-hold action far away and ease the filtering. Aliases coming from the phase information are less severe because phase samples experience a first-order-hold interpolation thanks to the integration in the PLL loop. The polar-modulated output signal of the power amplifier 80 is passed through a band pass filtering stage 90 before being transmitted.

In a general implementation of the phase-to-frequency converter 60, the input phase sampling rate and the output instantaneous-frequency update rate are not related by an integer K, but by a rational P/Q. Then, the input phase samples $\phi$[n] have to be interpolated by a factor Q in an interpolator 62, and further filtered using a reconstruction filter 64, before the instantaneous frequencies can be calculated according to our method but with a down-sampling factor P. In FIG. 2, calculation of the instantaneous frequency is split into a down-sampling function performed by a down-sampler 66 and phase-to-frequency conversion function performed by a phase-to-frequency calculator 68. However, it is noted that the processing of blocks 66 and 68 may be combined in a single phase-to-frequency conversion calculation block. Moreover, the processing of blocks 62 to 68 may be implemented by at least one digital signal processor, wherein each block may be a separate hardware unit or a software routine controlling the at least one digital signal processor.

Figure 3:
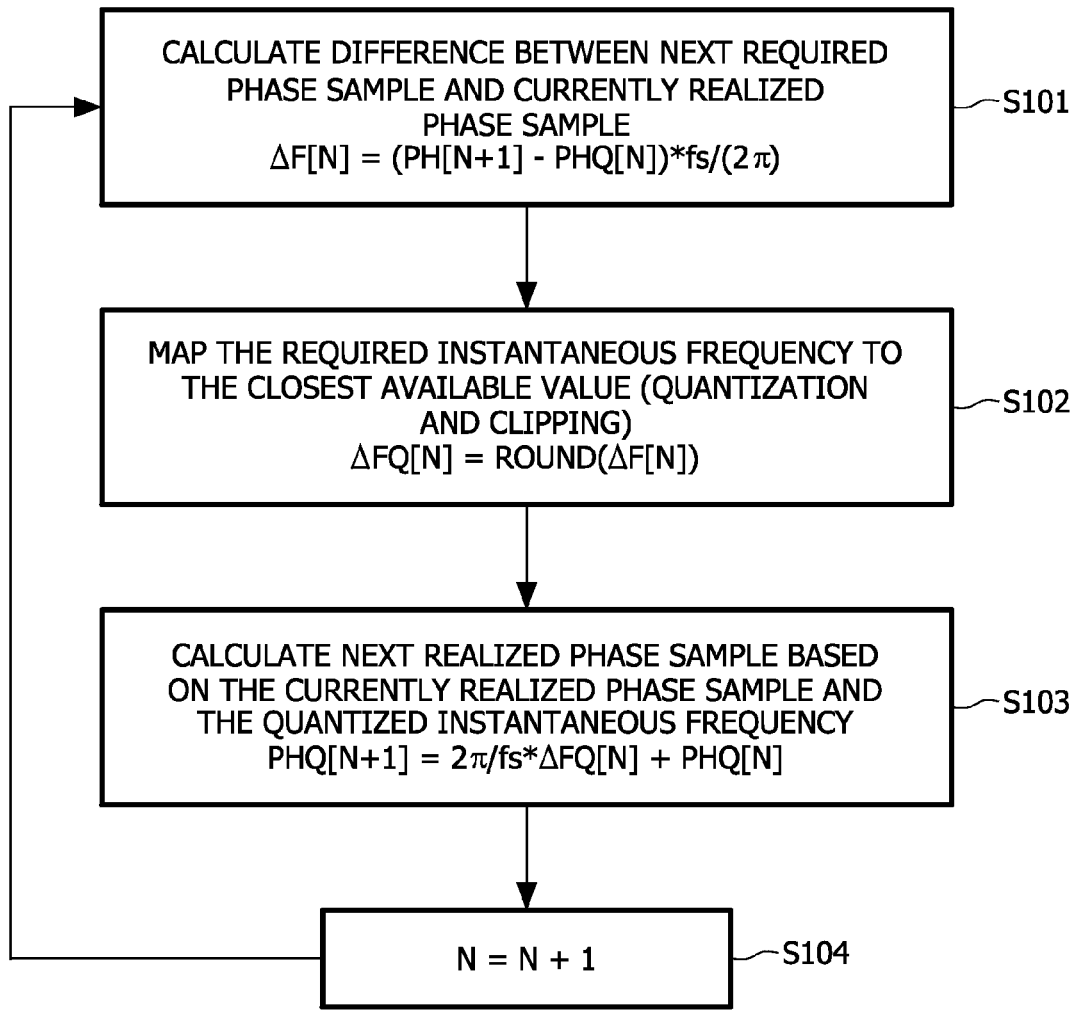
FIG. 3 shows a schematic flow diagram of a procedure for deriving an instantaneous frequency without rate conversion.

FIG. 3 shows a schematic flow diagram of a procedure for deriving an instantaneous frequency without rate conversion. The use of clocked, digitally controlled DCOs implies that their oscillating frequency takes discrete values at discrete times. These devices approximate the wanted phase by a piece-wise linear signal. A simple procedure to derive the instantaneous frequency offsets (with respect to the center of the channel) of such DCOs, including both quantization and clipping is depicted in FIG. 3. In this case, the output instantaneous-frequency update rate is the same as the input phase sampling rate.

In step S101, the difference between the next required phase sample and a currently realized phase sample is calculated. Then, in step S102, quantization and clipping is performed by mapping the required instantaneous frequency to the closest available quantization value. Thereafter, in step S103, the next realized phase sample is calculated based on the currently realized phase sample and the quantized instantaneous frequency. Finally, the running parameter N is incremented and the procedure jumps back to repeat step S101 for the next required phase sample.

Figure 4:
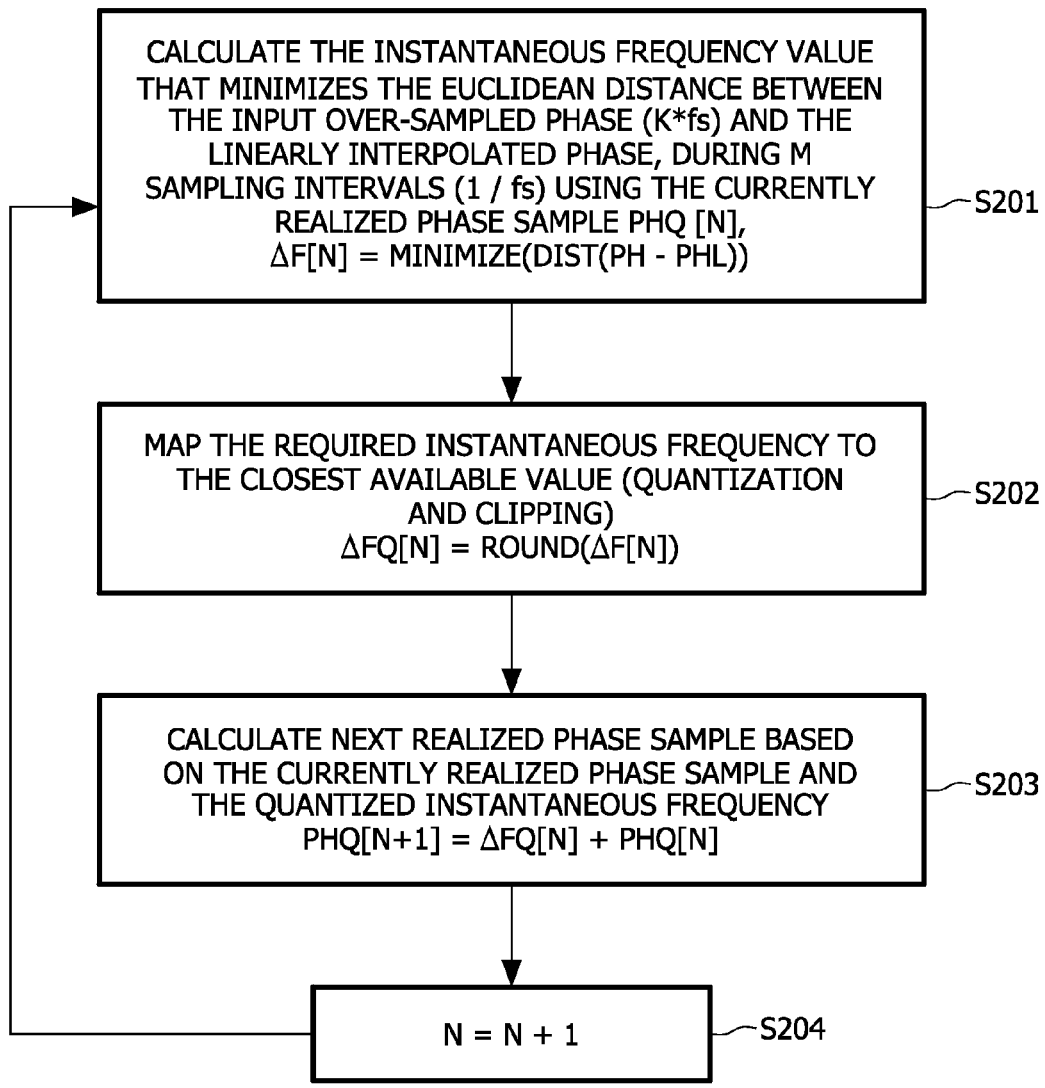
FIG. 4 shows a schematic flow diagram of a procedure for deriving an instantaneous frequency with rate conversion according to the first preferred embodiment.

FIG. 4 shows a schematic flow diagram of a procedure of the phase-to-frequency calculator 68 for deriving an instantaneous frequency with rate conversion according to the first preferred embodiment. In FIG. 4, the required instantaneous frequency update rate (sampling rate) is smaller than the input phase update rate (sampling rate). Assuming, for the time being, that the input sampling rate is K times larger than the output sampling rate ($f_s$). Then, taking into account a predetermined number M of output sampling periods, the slope (instantaneous frequency) that minimizes the distance between the input phase samples and the output phase samples up-sampled by a factor K using linear interpolation is calculated in step S201. In particular, the instantaneous frequency value that minimizes the Euclidean distance between the input over-sampled phase ($Kf_s$) and the linearly interpolated phase, during M sampling intervals ($1/f_s$) using the currently realized phase sample.

This slope is then quantized and clipped in step S202 by mapping the required instantaneous frequency to the closest available quantization value. Then, the next realized phase sample is calculated in step S203 based on the currently realized phase sample and the quantized instantaneous frequency. After that, the running parameter N is incremented in step S204 and the procedure jumps back to step S201 to repeat the above procedure.

The inclusion of M sampling intervals in the calculation of the current instantaneous frequency according to FIG. 4 avoids the selection of local minima, which might worsen the phase signal approximation in subsequent sampling intervals.

As an example, a polar transmitter used for transmitting IEEE 802.11a/g signals is now considered.

Figure 5:
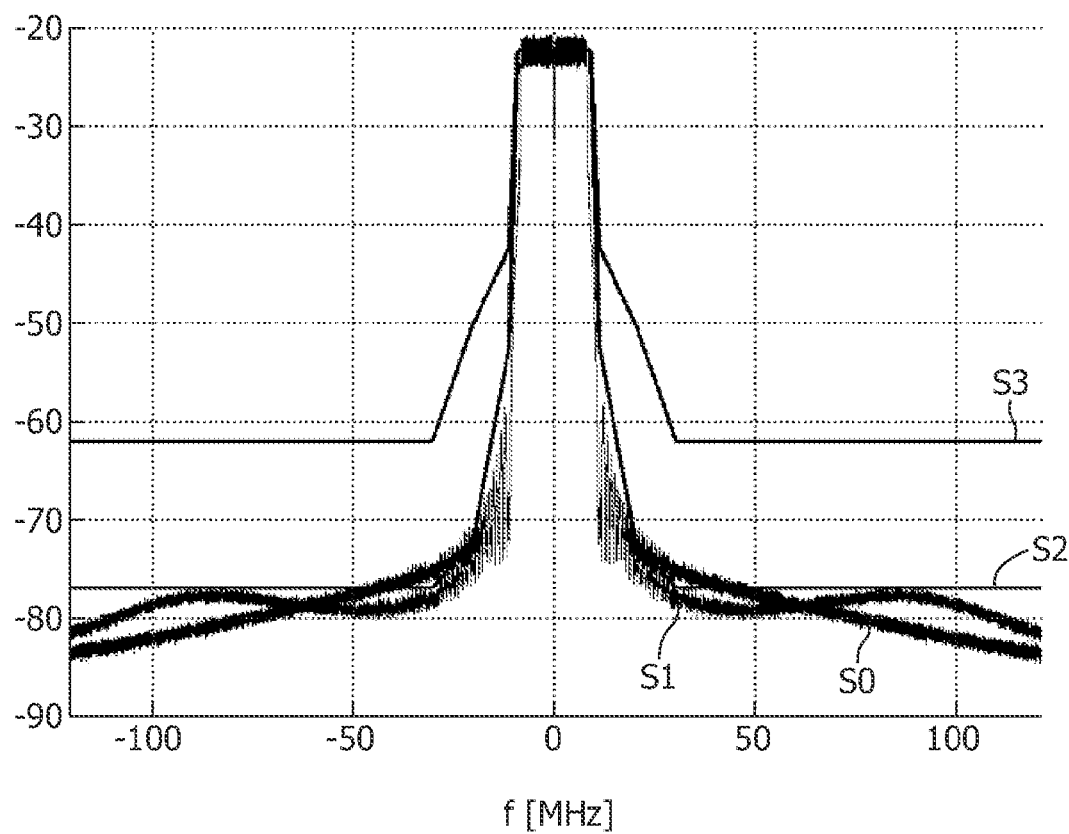
FIG. 5 shows a frequency diagram of output transmission spectra and masks.

FIG. 5 shows a frequency diagram of output transmission spectra and masks for the above example. Assuming also that the baseband engine produces phase samples at 400 MHz, but in order to save power or due to speed limitations, the instantaneous DCO frequency cannot be changed at a pace faster than 200 MHz. In a conventional system, the 400 MHz data stream is thus decimated to 200 MHz and fed to the phase-to-frequency converter, which leads to an output spectrum S0 and thus does not satisfy tight limits set by an exemplary project mask S2 below a more general and less limiting IEEE mask S3.

However, according to the preferred embodiments involving phase-to-frequency conversion with down-sampling, the 400 MHz data stream can be directly fed to the phase-to-frequency converter 60 of FIG. 2, and an improved output spectrum S1 which meets the criteria of the project mask S2 can be obtained.

However, looking at FIG. 5, it can be observed that the improved output spectrum S1 obtained from the first preferred embodiment presents two detrimental bumps between 50 and 100 MHz. This phenomenon will be explained later based on FIG. 7.

Figure 6:
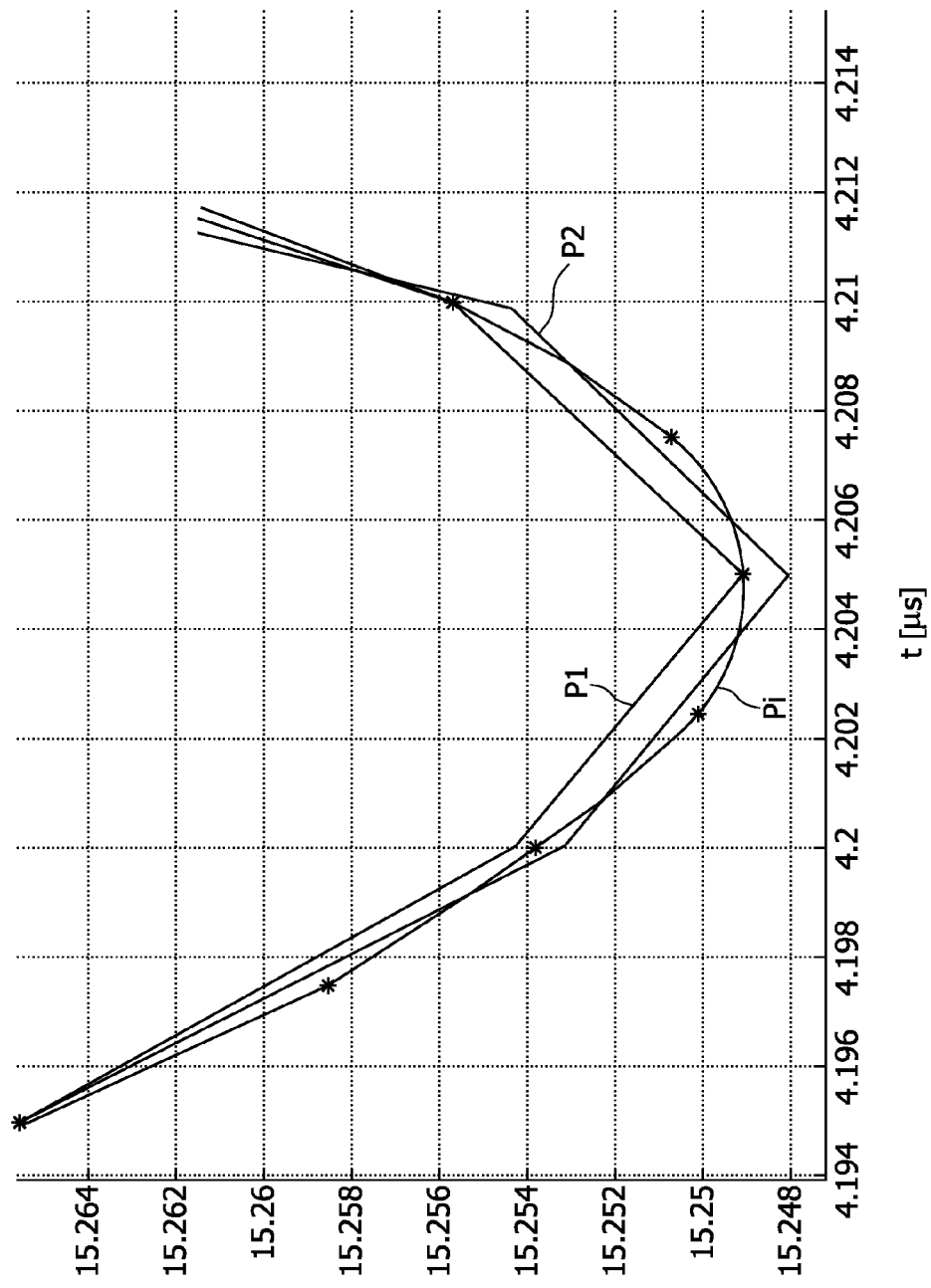
FIG. 6 shows a time diagram of reconstructed phase output signals at a signal valley.

FIG. 6 shows a time diagram of a reconstructed phase output at a signal valley. Here, a piece of the reconstructed phase signal in the time domain is shown. An ideal curve Pi corresponds to the phase synthesized by an ideal polar transmitter with infinite update frequency and infinite number of bits (ideal case). The ideal curve Pi connects all available phase samples ("*") at 400 MHz. A first piece-wise linear line P1 corresponds to the reconstructed phase using phase input information sampled at 200 MHz, while a second piece-wise linear line P2, which is also updated at 200 MHz, is obtained taking into account sampling instants between the update instants, i.e., using samples at 400 MHz. This second line P2 corresponds to the piece-wise linear signal according to the first preferred embodiment, which minimizes de Euclidian distance between the ideal phase and the finally reconstructed phase.

Figure 7:
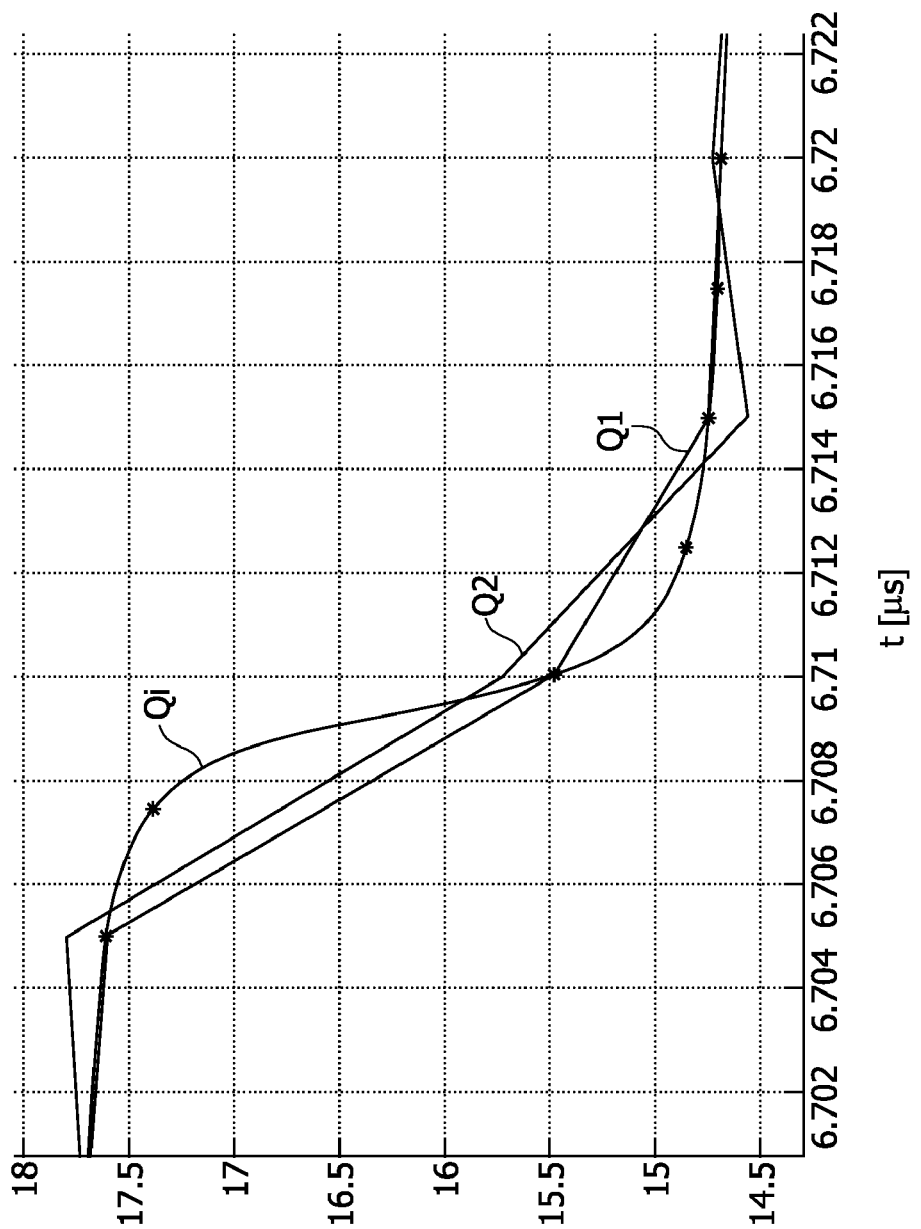
FIG. 7 shows a time diagram of reconstructed phase output signals at a fast transmission.

FIG. 7 shows a time diagram of reconstructed phase output signals at a fast transition. Again, an ideal curve Qi is shown, which connects all available phase samples ("*") at 400 MHz. A first piece-wise linear line Q1 corresponds to the reconstructed phase using phase input information sampled at 200 MHz, while a second piece-wise linear line Q2, which is also updated at 200 MHz, is obtained taking into account sampling instants between the update instants, i.e., using samples at 400 MHz. This second line Q2 corresponds to the piece-wise linear signal according to the first preferred embodiment, which minimizes de Euclidian distance between the ideal phase and the finally reconstructed phase. From FIG. 7 it can be gathered that for sudden phase changes, the proposed phase-to-frequency conversion tends to "ring" before settling down again. This effect might occur if the optimization interval is too short (i.e. the parameter M is too small), or simply because, despite the ringing, the Euclidian distance is minimized.

However, the above "ringing" phenomenon can be kept under control with a very small modification of the first preferred embodiment, which leads to the following second preferred embodiment.

FIG. 8 shows a schematic flow diagram of a modified procedure of the phase-to-frequency calculator 68 for deriving an instantaneous frequency, according to the second preferred embodiment. The idea is to switch to the simple linear interpolation method of FIG. 3 when rapid transitions are detected (like the one in FIG. 7), and use the optimized reconstruction method of FIG. 4 otherwise. The definition of "rapid transition" can be parameterized, e.g., by a slope size ΔFc. Then, the detection can be done a predetermined number of samples ahead, e.g., L samples.

According to FIG. 8, it is checked in step S301 whether there is any instantaneous frequency, which is larger than a predetermined threshold value ΔFc, among the coming L samples. This can be achieved by a simple frequency calculation and comparison operation. If a larger instantaneous frequency has been determined, the procedure branches to step S302 where the simple frequency calculation procedure of FIG. 3 is applied to derive the instantaneous frequency. Otherwise, if no calculated instantaneous frequency is larger than the predetermined threshold value ΔFc, the procedure branches to step S303 where the distance minimization procedure of FIG. 4 is applied to derive the instantaneous frequency. In both cases, the procedure continues with step S304 where the running parameter N is incremented and the procedure jumps back to step S301 to repeat the above procedure.

The modification according to the second preferred embodiment has been tested, and indeed, the two detrimental bumps of FIG. 5 can be eliminated when choosing the right threshold value ΔFc, while still benefiting from noise shaping.

It is noted that the preferred embodiment can be used in any polar transmitter architecture for various wireless standards including but not restricted to IEEE 802.11a/b/g, IEEE 802.16 and IEEE 802.15.

In summary, a polar transmission method and a polar transmitter for transmitting phase and amplitude components derived from in-phase (I) and quadrature-phase (Q) components of an input signal have been described. A first conversion is provided for converting the in-phase (I) and quadrature-phase (Q) components into the phase and amplitude components at a first sampling rate. Additionally, a second conversion is provided for converting the phase component into a frequency component, wherein the second conversion comprises a rate conversion for converting the first sampling rate into a lower second sampling rate at which the frequency component is provided. Thereby, the second sampling rate can be used as a lower update rate in a digitally controlled oscillator in order to save power or because of speed limitations, while the surplus phase samples obtain due to the higher first sampling rate enable better approximation of the phase component after the digitally controlled oscillator. This better approximation accounts for a cleaner spectrum around the synthesized channel.

It is noted that the present invention is not restricted to the above preferred embodiments, but can be applied to any polar transmitter architecture which is based on a generation of separated amplitude and phase modulation signals from Cartesian I and Q components. The steps of the procedures of FIGS. 3, 4 and 8 can be implemented by discrete hardware units or by software routines or programs controlling a computer device, e.g., a digital signal processor or the like. Hence, the preferred embodiments may vary within the scope of the attached claims.

Finally but yet importantly, it is noted that the term "comprises" or "comprising" when used in the specification including the claims is intended to specify the presence of stated features, means, steps or components, but does not exclude the presence or addition of one or more other features, means, steps, components or group thereof. Further, the word "a" or "an" preceding an element in a claim does not exclude the presence of a plurality of such elements. Moreover, any reference sign does not limit the scope of the claims.

The invention claimed is:

1. A polar transmitter for transmitting phase and amplitude components derived from in-phase and quadrature-phase components of an input signal, said transmitter comprising:
    a first converter for converting said in-phase and quadrature-phase components into said phase and amplitude components at a first sampling rate; and
    a second converter for converting said phase component into a frequency component, and for rate-converting said first sampling rate into a lower second sampling rate at which said frequency component is provided.

2. The polar transmitter according to claim 1, wherein said second converter comprises an interpolator for interpolating input samples of said phase component at said first sampling rate by a first factor, a reconstruction filter for filtering the interpolated samples, and a down-sampler for down-sampling calculated samples of said frequency component by a second factor.

3. The polar transmitter according to claim 1, wherein said second converter comprises a frequency calculator for calculating said frequency component by using a currently realized sample of said phase component so that the distance between input samples of said phase component at said first sampling rate and a linearly interpolated phase during a predetermined number of sampling intervals is minimized.

4. The polar transmitter according to claim 3, wherein said frequency calculator is adapted to obtain a quantized frequency component by mapping a calculated frequency component to a closest available quantization value.

5. The polar transmitter according to claim 3, wherein said frequency calculator is adapted to calculate the next realized sample of said phase component based on said currently realized sample of said phase component and said quantized frequency component.

6. The polar transmitter according to claim 1, wherein said second converter comprises switching means for comparing a frequency component obtained from upcoming samples of said phase component with a predetermined threshold value, and for switching between said rate conversion and a linear approximation without rate conversion, in response to the result of said comparison.

7. The polar transmitter according to claim 1, wherein said frequency component is supplied to a digitally-controlled oscillator.

8. A method of transmitting phase and amplitude components derived from in-phase and quadrature-phase components of an input signal, said method comprising:
    a first conversion step for converting said in-phase and quadrature-phase components into said phase and amplitude components at a first sampling rate; and
    a second conversion step for converting said phase component into a frequency component, wherein said second conversion step comprises a rate conversion step for converting said first sampling rate into a lower second sampling rate at which said frequency component is provided.

9. A computer program product comprising code means for generating the steps of method claim 8 when run on a computer device.

* * * * *